United States Patent
Cama et al.

(10) Patent No.: US 6,211,457 B1
(45) Date of Patent: *Apr. 3, 2001

(54) EMI-SHIELDED CONNECTOR IN AN ELECTRONIC DEVICE

(75) Inventors: David M. Cama, Macedon; Anthony G. Chinnici, Rochester, both of NY (US)

(73) Assignee: Eastman Kodak Company, Rochester, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/992,894

(22) Filed: Dec. 18, 1997

(51) Int. Cl.[7] .................................................. H05K 9/00
(52) U.S. Cl. ................. 174/35 C; 174/35 R; 361/800; 361/816; 361/818; 361/752; 361/753; 361/789; 361/799; 439/607; 439/609; 439/939
(58) Field of Search ..................... 174/35 R, 35 C; 361/816, 818, 752, 753, 789, 799, 800; 439/607, 609, 939

(56) References Cited

U.S. PATENT DOCUMENTS

| | | |
|---|---|---|
| 3,311,792 | 3/1967 | Scoville ........................ 317/101 |
| 4,308,417 | 12/1981 | Martin .......................... 174/35 GC |
| 4,641,224 | 2/1987 | Reimer ......................... 361/424 |
| 4,689,723 | 8/1987 | Myers et al. ................... 361/424 |
| 4,744,006 | 5/1988 | Duffeld ......................... 361/413 |
| 5,329,066 | 7/1994 | Hansson ........................ 174/151 |
| 5,416,673 | 5/1995 | Yoshimitsu et al. ............. 361/809 |
| 5,702,271 | * 12/1997 | Steinman ....................... 439/676 |
| 5,709,569 | * 1/1998 | Buck et al. .................... 439/607 |
| 5,810,620 | * 9/1998 | Kobayashi et al. .............. 439/610 |

* cited by examiner

*Primary Examiner*—William A. Cuchlinski, Jr.
*Assistant Examiner*—Ronnie Mancho
(74) *Attorney, Agent, or Firm*—David M. Woods

(57) ABSTRACT

A shielded communications interface located within an electronic device is disclosed. The shielded communications interface is adapted to be connected to a plug of a peripheral external device and is subject to electromagnetic emissions (EMI) from electronic circuits which are grounded in the electronic device. The electronic device includes an enclosure having an opening through which the electronic circuits are accessed and a conductive inner wall surface that is connected to the ground of the electronic circuits. The shielded communications interface comprises a connector including a conductive housing and a plurality of pins which establish electrical connection between the plug and the electronic circuits, and a conductive EMI shield extending at least partially around the conductive housing. The conductive EMI shield is fastened to the conductive inner wall surface to thereby ground the conductive EMI shield and isolate EMI emissions generated by the electronic circuits in the electronic device from the connector.

17 Claims, 3 Drawing Sheets

EMI-SHIELDED CONNECTOR IN AN ELECTRONIC DEVICE

FIELD OF THE INVENTION

The invention pertains to the protection of components used in an electronic device from electromagnetic interference (EMI), and especially to EMI protection of a communications interface between an electronic camera and an external device, such as a host computer.

BACKGROUND OF THE INVENTION

It is highly desirable to provide EMI shielding for a communications interface, in an electronic device in order to isolate the interface from EMI signals that might be generated by circuitry in the device. One such communications interface is an interface defined by the IEEE (the Institute of Electrical and Electronic Engineers, Inc.) 1394–1995 standard. In the case of electronic imaging devices, the trend is toward development of smaller, tightly packed digital cameras. It is usually difficult, if not impossible, to remotely locate and thereby isolate a communications interface relative to the electronics in the camera, as could be done, e.g., in a computer system. Instead the interface lies well within the camera and closely adjacent to camera electronics. Thus it is especially important to isolate the interface from transmissions and signals that might be generated by circuitry in the camera.

The problem with some of the current communications interfaces, such as those which follow the IEEE 1394 interface standard, is that they are not designed to be electrically conductive to the product enclosure. More specifically, an interface defined by the IEEE 1394 interface standard, which is ordinarily attached to a circuit board in the camera, "floats" with respect to an opening in the product enclosure so that a connector plug can engage the forward area of the interface connector in the camera. This results in a "hot" area of EMI susceptibility, as well as a small "dead air" region between the connector and the enclosure that can act as an EMI radiator. Nonetheless, the general robustness of these interfaces often make them the desired choice for digital cameras. Particularly in the case of tightly packed high speed electronics in a modern digital camera, the performance of the camera may suffer unless EMI protection can be designed into the camera to include the communications interface.

SUMMARY OF THE INVENTION

The present invention is directed to overcoming one or more of the problems set forth above. Briefly summarized, according to one aspect of the present invention, a shielded communications interface located within an electronic device which is adapted to be connected to a plug of a peripheral external device and is subject to electromagnetic emissions (EMI) from electronic circuits which are grounded in the electronic device, the electronic device including an enclosure having an opening through which the electronic circuits are accessed and a conductive inner wall surface that is connected to the ground of the electronic circuits, the shielded communications interface comprising:

a connector including a conductive housing and a plurality of pins which establish electrical connection between the plug and the electronic circuits;

a conductive EMT shield extending at least partially around the conductive housing; and means for fastening the conductive EMT shield to the conductive inner wall surface to thereby ground the conductive EMI shield and isolate EMI emissions generated by the electronic circuits in the electronic device from the connector.

One advantage of the invention is that the inventive design allows for supression of EMI by intimate electrical contact between the EMI shield and the grounded product enclosure, thereby allowing the use of the connector in high speed digital devices, such as digital cameras.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Because imaging devices employing electronic sensors are well known, as are communications interfaces such as those that meet the IEEE 1394 interface standard, the present description will be directed in particular to elements forming part of, or cooperating more directly with, apparatus in accordance with the present invention. Elements not specifically shown or described herein may be selected from those known in the art.

Figure 1:
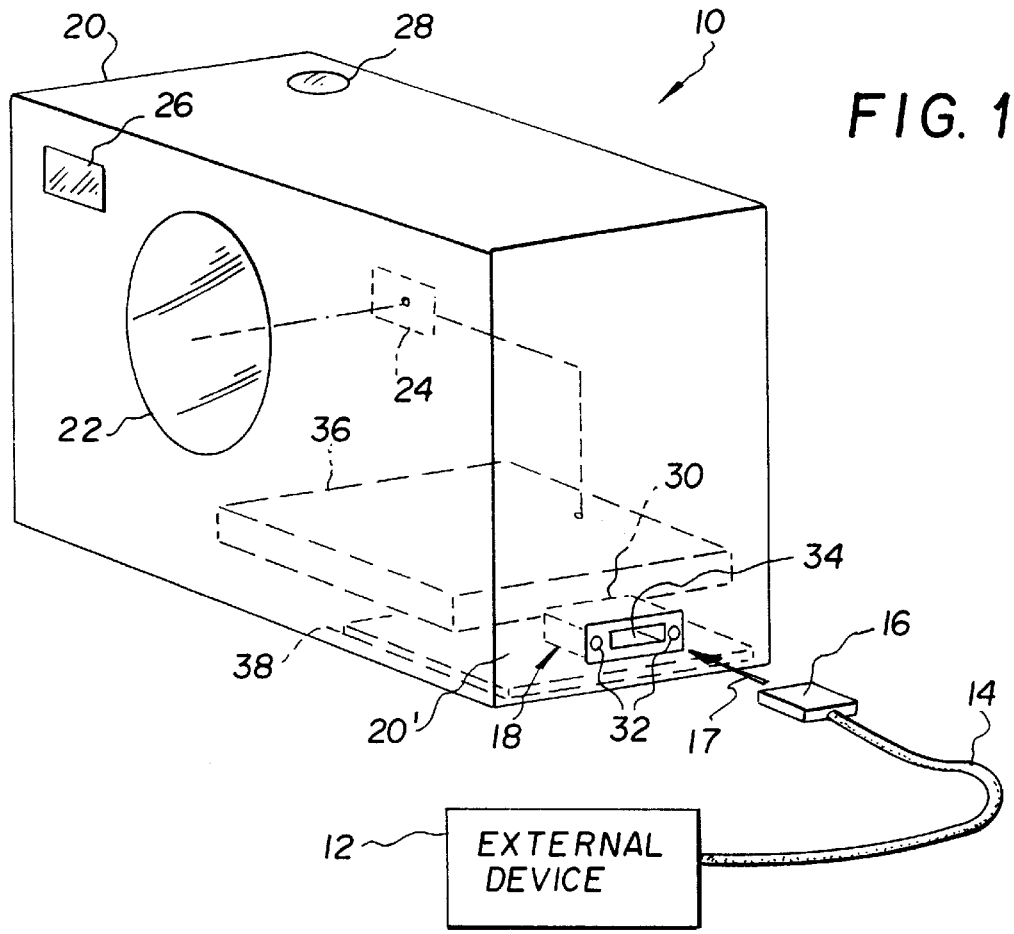
FIG. 1 is a perspective view of an electronic camera having a communications interface incorporating an EMI-shielded connector according to the invention.

FIG. 1 illustrates a camera 10 that is adapted for use with an external device 12, such as a host computer, that is connected to the camera 10 via a cable 14 and a plug 16. The plug 16 is inserted according to an arrow 17 into a communications interface 18 which is EMI-protected according to the invention. Although the type of interface is not critical to the invention, the figures are drawn in relation to the connector enclosure that meet the IEEE 1394 interface standard. The camera is formed in relation to a product enclosure, such as a case 20, on which a lens 22 is mounted in optical relation to an image sensor 24. An optical viewfinder 26 is used to frame the image relative to the image sensor 24 prior to capture. The image sensor 24 is driven to capture an image when a user actuates a shutter release 28. The communications interface 18 includes an EMI-protected connector 30 fastened with mounting screws 32 to a sidewall 20' of the case 20. The connector 30 is accessed through an opening 34 in the side wall 20'. The connector 30 is shielded according to the invention against electromagnetic interference (EMI) from the electronics in the camera. More specifically, the camera 10 includes electronics components 36,38 that are capable of EMI emissions, and which are shown situated in close proximity to the communications interface 18. While not particularly illustrated in FIG. 1, it is often the case that the camera 10 is very small in size and the electronics components 36,38 are necessarily, for lack of space, close to the communications interface 18.

In operation, the plug 16 is inserted through the opening 34 into the connector 30 in order to establish connection between the external device 12 and the electronic components 36,38 in the camera 10. The external device 12 may be one of a variety of conventional devices. For example, the external device 12 is typically a conventional host computer, such as a laptop or desktop computer, that connects to the internal electronic components 36,38 in order to process and save the captured images. However, the external device 12 may also be a conventional modem that connects the camera 10 into an external network, a conventional video processor and display for displaying the captured images, a conventional printer for making copies of the captured images, and so on. As the aforementioned examples of types of external devices are not intended to be exhaustive, the invention may be used in interfacing with other devices not described herein. Likewise, the invention may be used with interfaces other than those that meet the IEEE 1394 interface standard, particularly interfaces including connectors which are not grounded to the product enclosure.

Figure 2:
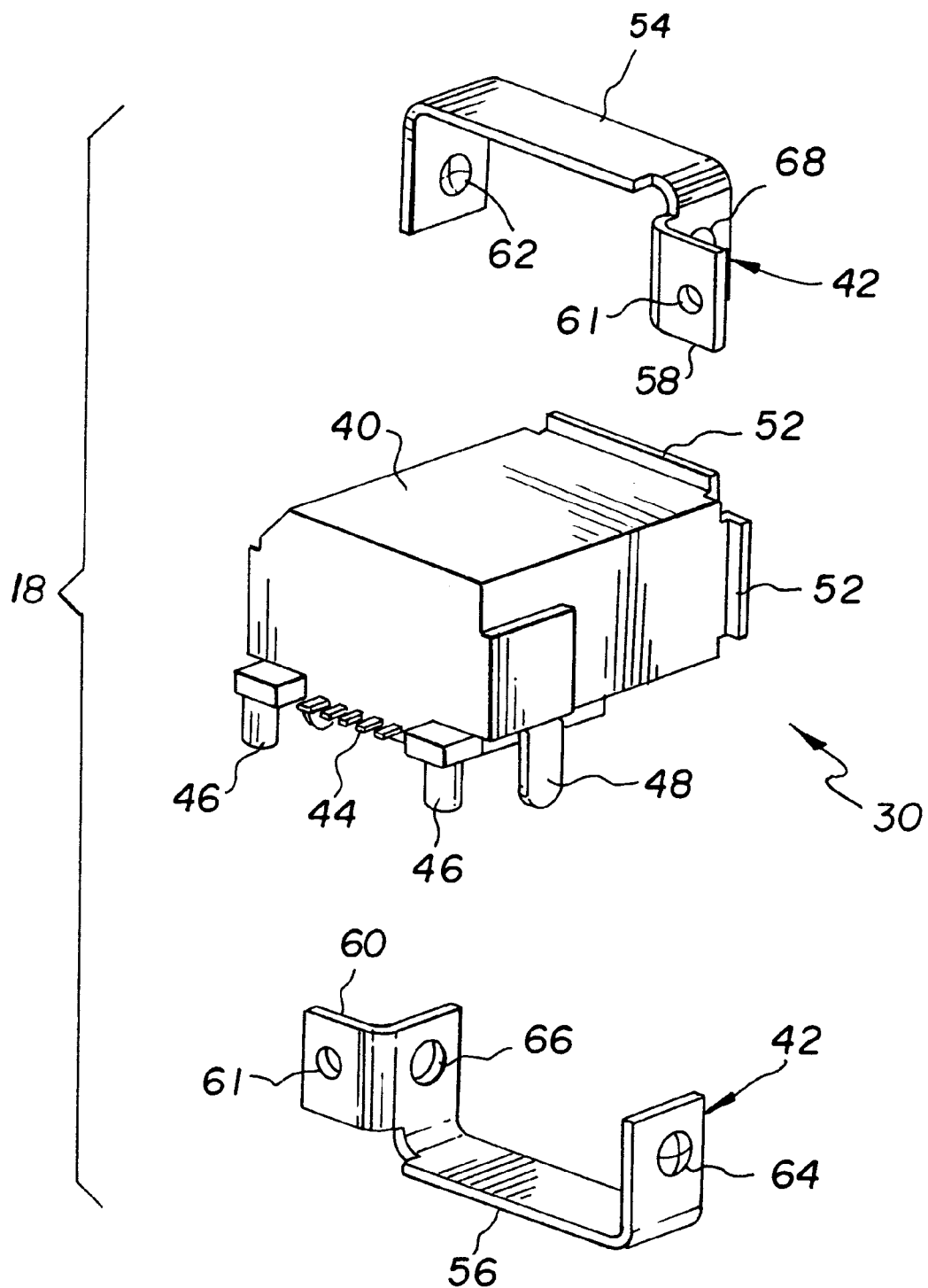
FIG. 2 is an exploded view of the EMI-shielded connector shown in FIG. 1.
Figure 3:
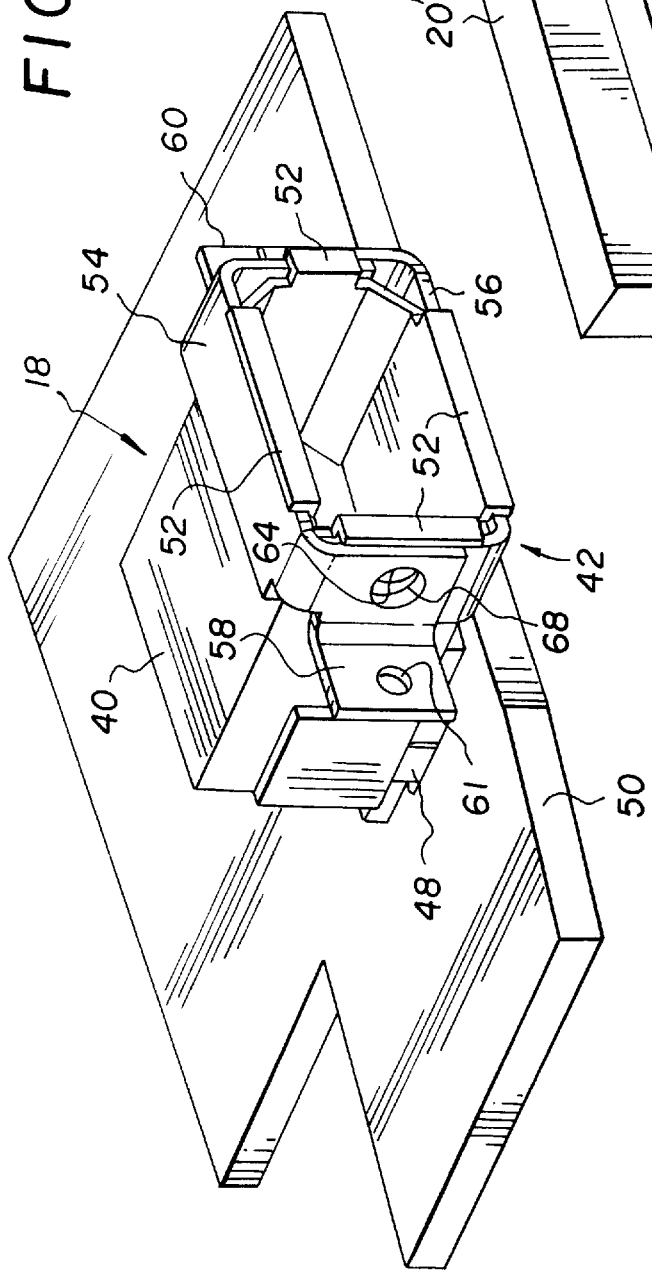
FIG. 3 is an assembled front perspective view of the EMI-shielded connector shown in FIG. 2 attached to a circuit board.

Referring to FIGS. 2 and 3, the interface 18 includes the connector 30 and a bracket 42. The connector 30 includes a housing 40. The housing 40 includes a rearwardly depending region for exposing a set of electrical contacts 44, a pair of locating pins 46 and a spade 48 for locating the connector 30 relative to a circuit board 50, and a plurality of metal tabs 52 extending outwardly from the metal housing 40 at a forwardly depending region. The spade 48 is soldered into the printed circuit board 50 in order to locate the connector 30 on the board 50. The bracket 42 includes two interconnecting pieces 54,56, specifically a top piece 54 and a bottom piece 56, each having a respective connector flange 58,60. Each flange 58,60 is threaded with holes 61 for receiving the mounting screws 32. The pieces 54,56 further include respective outwardly convex bumps 62,64 and corresponding smaller-dimensioned holes 66,68 for seating the bumps in the assembled bracket.

Figure 4:
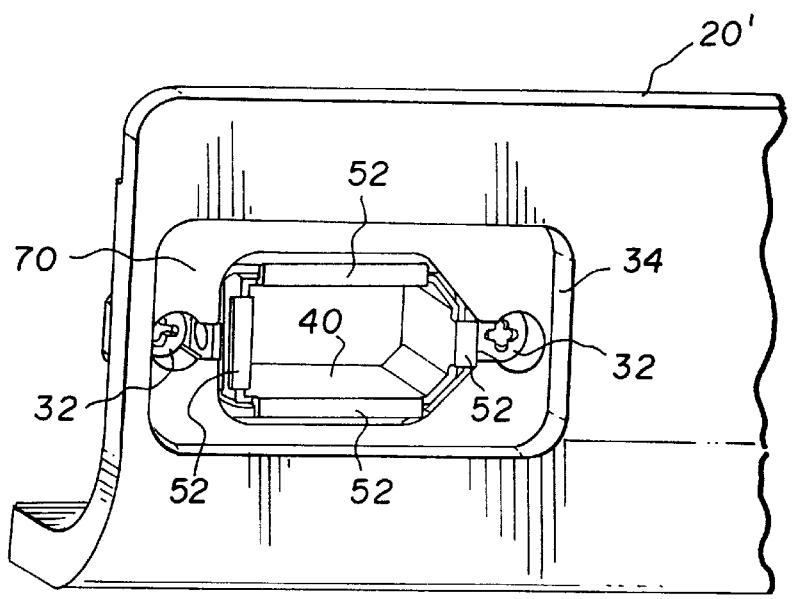
FIG. 4 is a front perspective view through the product enclosure of the connector shown in FIG. 3.
Figure 5:
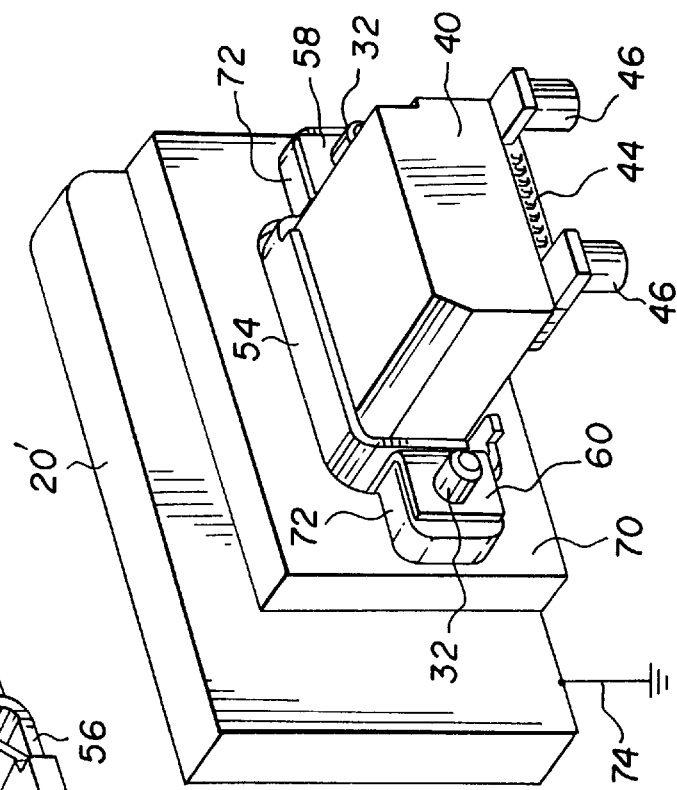
FIG. 5 is a rear perspective view of the connector shown in FIG. 4, showing attachment to the grounded inside wall of the product enclosure.

The interconnecting pieces 54,56 assemble around the housing 40 rearwardly of the upturned tabs 52 into an interference fit such that the bump 62 seats into the hole 66, and the bump 64 seats into the hole 68. The bracket 42 is conductive, e.g., formed of sheet metal, and forms an EMI shield around the housing 40. When assembled as shown in FIG. 3, the bracket 42 encircles the metal housing 40 adjacent to the tabs 52. As shown in FIGS. 4 and 5, the connector 30 is mounted against the wall 20' of the case 20. The wall 20' includes an inwardly depending face 70 with blocks 72 for supporting the connector flanges 58,60. The inner surface of the wall 20', including the inner surfaces of the face 70 and the blocks 72 and the connecting portions therebetween, is covered with a seamless conductive coating that is electrically connected to a circuit ground 74 in the camera 10. (Such conductive coatings are well known and conventionally applied to electronic enclosures.) In order to better illustrate the features of the invention, FIGS. 3, 4 and 5 show the housing 40 from the inside without the electrical components of the connector; it is to be understood that the unshown connector components are conventional to the particular interface and would occupy the interior space of the housing 40.

In accordance with the invention, the bracket 42 is fastened to the case wall 20' through the connector flanges 58,60 such that the bracket 42 is grounded to the conductive inner wall surface that is connected to the camera circuit ground 74, thereby at least partially isolating the interface 18 from EMI emissions generated by circuits in the camera 10. More specifically, the mounting screws 32 thread into the holes 61 and draw the connector flanges 58,60 into engagement with the blocks 72, which form part of the grounded interior wall surface of the case wall 20'; tightening the bracket 42 against the blocks 72 consequently draws the connector flanges 58,60 into tight electrical contact with the conductive inner wall surface of the wall 20'. At the same time, the metal tabs 52 are positioned nearby, but slightly offset from, the case wall 20' so the plug 16 can grasp the tabs 52. The slight air space between tabs 52 and the case wall 20' tends to act as an antenna and thus become a secondary radiator of EMI. Thus the bracket 42 forms a ground path for helping to suppress EMI emissions from the camera circuits 36,38 and further helping to suppress EMI radiation from the narrow air space between the tabs 52 and the inner wall surface of the case wall 20'. Additionally, electrical contact between the tabs 52 and the conductive inner wall grounds the entire metal housing 40.

Although the bracket 42 is shown to be composed of interconnecting parts that completely surround the metal housing 40, the bracket 42 could alternatively be a unitary piece that, e.g., slides over or snaps over the housing 40. Especially in the latter case, the bracket 42 might not extend completely around the housing 40, as long as it substantially encompasses the housing 40. The means for fastening the connector 30 to the case wall 20' is shown to be a pair of screws 32, but this could just as well be a nut and bolt arrangement, a spring clip, or other fastening techniques that serve to draw the components together. Moreover, the bracket 42 is shown to be a relatively narrow piece that extends around the housing 40; the bracket 42 could, however, be a wider piece that extends further rearwardly over the housing 40.

The invention has been described with reference to a preferred embodiment. However, it will be appreciated that variations and modifications can be effected by a person of ordinary skill in the art without departing from the scope of the invention. In particular, while the connector 30 has been described for use in a camera, it should be understood that it may be used in any electronic device requiring EMI isolation.

Parts List
10 camera
12 external device
14 cable
16 plug
17 arrow
18 communications interface
20 case
22 lens
24 image sensor
26 optical viewfinder
28 shutter release
30 connector
32 screws
34 opening
36 electronic circuit
38 electronic circuit
40 metal housing
42 bracket
44 electrical contacts
46 locating pins
48 spade
50 circuit board
52 metal tabs
54 top piece
56 bottom piece
58 connector flange 60 connector flange
61 threaded hole
62 bump
64 bump
66 hole
68 hole
70 face
72 block
74 circuit ground

What is claimed is:

1. A shielded communications interface located within an electronic device which is adapted to be connected to a plug of a peripheral external device and is subject to electromagnetic emissions (EMI) from electronic circuits within the electronic device, the electronic device including an enclosure having an opening through which the electronic circuits are accessed and a conductive inner wall surface that is connected to the ground of the electronic circuits, the shielded communications interface comprising:

a connector comprising a conductive housing and a plurality of pins which establish an electrical connection between the plug and the electronic circuits;

a conductive EMI shield external to said connector in contact with the conductive housing and covering a gap between the enclosure and said connector; and a fastener fastening said conductive EMI shield to the conductive inner wall surface to thereby ground said conductive EMI shield and isolate EMI emissions generated by the electronic circuits in the electronic device from said connector.

2. An interface as claimed in claim 1 wherein said EMI shield extends completely around the conductive housing.

3. An interface as claimed in claim 1 wherein said conductive EMI shield comprises a metal bracket with one or more connector flanges depending outwardly from the bracket, and said fastener comprises a connection to said one or more connector flanges which draws the connector flanges into electrical contact with the conductive inner wall surface of the enclosure to ground said conductive EMI shield.

4. An interface as claimed in claim 1, wherein the conductive housing has tabs at a forward area near the opening causing the gap between the enclosure and said connector, and said EMI shield extends around the conductive housing rearwardly of the tabs.

5. A shielded interface as claimed in claim 1, wherein said connector further comprises tabs to grasp the plug, the gap between the enclosure and said connector is defined by the tabs on said connector; and said conductive EMI shield comprises a thickness, wherein the thickness covers the gap between the enclosure and said connector.

6. A shielded interface as claimed in claim 5, wherein the gap is between the conductive inner wall surface of the enclosure and the conductive housing of said connector.

7. A shielded interface as claimed in claim 6, wherein said connector is adapted to receive a plug that complies with the IEEE 1394 and/or USB interface standards.

8. A shielded communications interface mounted within an electronic camera which is adapted to be connected to a plug of a peripheral device and is subject to electromagnetic emissions (EMI) from electronic circuits situated in the camera in close proximity to the shielded communications interface and which are grounded, said camera including a case having an opening through which the electronic circuits are accessed and a conductive inner wall surface that is connected to a camera circuit ground, the shielded communications interface comprising:

a connector comprising a conductive housing and a plurality of pins which establish an electrical connection between the plug and the electronic circuits, such conductive housing having metal tabs at a forward area thereof;

a conductive EMI shield external to said connector and extending at least partially around the conductive housing rearwardly of the metal tabs and covering a gap between the case and said connector caused by the tabs; and a fastener fastening said conductive EMI shield to the conductive inner wall surface to thereby ground said conductive EMI shield and isolate the EMI emissions generated by the electronic circuits in the electronic camera from said connector.

9. An interface as claimed in claim 8, wherein said EMI shield extends completely around the conductive housing.

10. An interface as claimed in claim 8, wherein said conductive EMI shield comprises a metal bracket with one or more connector flanges depending outwardly from the bracket, and said fastener comprises a connection between said one or more connector flanges and the case which draws the connector flanges into electrical contact with the conductive inner wall surface to ground said conductive EMI shield.

11. An interface as claimed in claim 10, wherein the metal bracket comprises two interconnecting pieces, each with a connector flange, that assemble around the enclosure.

12. A shielded interface as claim in claim 8, wherein the pins of said connector are adapted to receive two separately shielded pairs of signal lines, and two power lines from the plug.

13. A shielded interface as claim in claim 8, wherein said connector is compliant with the IEEE 1394, 1394a, 1394b, 13694.1, 1394.2, and/or USB interface standards.

14. A shielded interface as claimed in claim 13, wherein the gap is between the conductive inner wall surface of the case and the conductive housing of said connector.

15. A shielded interface between electronics within a case and an external device, comprising:

a connector disposed in an opening in the case, wherein said connector connects the external device to the electronics within the case, complies with IEEE 1394 and/or USB standards, and defines a gap between said connector and the case;

a shield disposed external to said connector and covering the gap;

wherein said connector and said shield prevent electromagnetic emissions from the electronics within the case from escaping through the opening in the case.

16. A shielded interface of claim 15, wherein the case further comprises a conductive inner wall surface disposed internally to the case, and the gap is defined between the conductive inner wall surface and said connector.

17. A shielded interface of claim 16, wherein said connector further comprises a conductive housing, and wherein the conductive housing of said connector and said shield are electrically grounded through the conductive inner wall surface of the case.

* * * * *